United States Patent [19]
Shin et al.

[11] Patent Number: 5,657,280
[45] Date of Patent: Aug. 12, 1997

[54] DEFECTIVE CELL REPAIRING CIRCUIT AND METHOD OF SEMICONDUCTOR MEMORY DEVICE

[75] Inventors: Choong-Sun Shin, Seoul; Yong-Sik Seok, Suwon, both of Rep. of Korea

[73] Assignee: Samsung Electronics Co., Ltd., Suwon, Rep. of Korea

[21] Appl. No.: 580,737

[22] Filed: Dec. 29, 1995

[30] Foreign Application Priority Data

Dec. 29, 1994 [KR] Rep. of Korea .................. 38502/94

[51] Int. Cl.[6] ............................................. G11C 7/00
[52] U.S. Cl. ................ 365/200; 365/230.06; 365/225.7
[58] Field of Search ................................. 365/200, 201, 365/230.06, 225.7

[56] References Cited

U.S. PATENT DOCUMENTS 5,359,561  10/1994  Sakomura et al. ............... 365/200 X

*Primary Examiner*—Joseph A. Popek
*Attorney, Agent, or Firm*—Cushman Darby & Cushman, IP Group of Pillsbury Madison & Sutro LLP

[57] ABSTRACT

A defective cell repairing circuit for repairing a defective cell in a packaged semiconductor memory device enables repair mode operations for mapping an address of a detected defective cell to a redundant cell. The address of the defective cell is programmed by selectively cutting fuses corresponding to each bit of the defective cell address. The defective cell address programming operation uses input terminals on the packaged semiconductor memory device which are used for address signals in a normal operation mode, so that no additional pins are required. Repair mode operations are prevented after the repair mode is completed. Thereafter, an external address supplied to the semiconductor memory device is compared with the programmed defective cell address determined by the state of the fuses, and a redundant cell is selected if the two addresses correspond.

18 Claims, 7 Drawing Sheets

DEFECTIVE CELL REPAIRING CIRCUIT AND METHOD OF SEMICONDUCTOR MEMORY DEVICE

BACKGROUND OF THE INVENTION (1) Field of the Invention

The present invention relates to a defective cell repairing circuit and method of a semiconductor memory device, and more particularly to a circuit and method capable of repairing a defective cell after the completion of the packaging process for the device.

(2) Description of the Related Art

Generally, semiconductor memory devices are designed to include a redundant cell to replace a defective cell occurring among normal cells, to improve the yield of a memory production process. Such devices are further designed to include a fuse and a redundant cell selecting circuit for fusably remapping the redundant cell to the address of the defective cell, so that the redundant cell is selected when the address of the defective cell is thereafter inputted from outside.

A conventional defective cell repairing circuit for performing the functions as described above is shown in FIG. 1, and disclosed in U.S. Pat. No. 4,473,895 issued to Tatematsu. In the operation of the circuit of FIG. 1, when an address is applied from the outside, it is compared with the stored defective cell address, thereby determining whether or not the redundant cell is selected. The defective cell address is stored by cutting a fuse 61 corresponding to the address lines for selecting the defective cell.

According to the conventional circuit in FIG. 1, in which the fuse 61 is used to store the defective cell address, the fuse cutting method is as follows. A high voltage is applied to a pad 63 and the address corresponding to the defective cell address is provided from the outside. Accordingly, a node of either the address Ai (i=0–8) or $\overline{Ai}$ goes to a logic "high" state, thereby turning ON an NMOS transistor 62 connected to the corresponding node. Thereby, a large amount of an electrical current due to the high voltage applied to pad 63 flows through the fuse 61, and each fuse 61 corresponding to the defective cell address is cut. At this time, one of the two fuses 61 connected to the two NMOS transistors 62 for each address pair Ai and $\overline{Ai}$ is inevitably cut. In other words, each bit of the defective cell address is stored according to which one of the two fuses 61 is cut.

After repairing the defective cell, when an address which does not correspond to the defective cell is provided from the outside, an NMOS transistor 64 is turned ON by a clock φP when the semiconductor memory device is enabled, and then the node L is precharged to a power supply voltage level. Because the applied address does not correspond to the defective cell, at least one of the NMOS transistors 62 connected to an uncut fuse 61 is turned ON. The node L is discharged to a logic "low" state, thereby turning OFF an NMOS transistor 65. Thereafter, when a clock φR is enabled, a node $\overline{P}$ is discharged to the logic "low" level. According to the conventional circuit, if the node $\overline{P}$ is the logic "low" state, a normal cell is selected.

Finally, after repairing the defective cell, when an address which corresponds to the defective cell is provided from the outside after the node L is precharged to the logic "high" state by the clock φP, the inputted address is the same as the programmed address. Therefore, the NMOS transistors 62 connected to the fuses 61 that were previously cut are all turned OFF. Accordingly, since a discharging path is not formed by maintaining the node L in the logic "high" state, the NMOS transistor 65 maintaining the turned-ON state. As a result, though the NMOS transistor 65 is temporarily turned ON by the clock φR, the node $\overline{P}$ maintains the logic "high" state. Accordingly, the redundant cell instead of the defective cell is selected.

In the conventional semiconductor memory device as mentioned above, in order to program the defective cell address, an electrical fuse cutting method or a fuse cutting method using a laser beam is used. In the case Of the laser beam cutting method, it is possible to repair the defective cell detected in a wafer state, but it is impossible to repair the defective cell detected in a package state. Likewise, in the case of the electrical fuse cutting method as shown in FIG. 1, if the additional pad 63 is required to apply fuse cutting power to the wafer, it becomes impossible to repair the defective cell after the packaging process.

As the integration of the semiconductor memory device increases, the number of memory cells and chip sizes accordingly increase, but the design rule decreases. Therefore, the possibility that a defective cell occurs is increased. Hence, if it is possible to repair a defective cell detected after the packaging process as well as in the wafer state, the production yield can be improved. Presently, a burn-in test is commonly used to detect defective cells and to ensure the reliability of the device. The burn-in test is normally performed on devices in the package state. Therefore, a novel device capable of repairing defective cells generated by a burn-in test performed after the package state is greatly needed.

SUMMARY OF THE INVENTION

Accordingly, it is an object of the present invention to provide a circuit and method of a semiconductor memory device capable of repairing a defective cell generated in the device after a package process is completed.

Another object of the present invention is to provide a circuit and method of a semiconductor memory device capable of programming an address of a defective cell in a package state without requiring an additional pin.

Still another object of the present invention is to provide a circuit and method of a semiconductor memory device capable of distinguishing a defective cell repair mode from a normal operation mode in accordance with an external input without requiring an additional pin after a package process.

Yet another object of the present invention is to provide a defective cell repairing circuit and method of a semiconductor memory device capable of executing a plurality of defective cell repair modes in accordance with an external input after a package process.

A still further object of the present invention is to provide a circuit and method of a semiconductor memory device capable of programming an address of a defective cell in accordance with an external input provided in a defective cell repair mode, comparing the address programmed in the defective cell repair mode with an address inputted in a normal operation mode, after a package process, and selecting a normal cell or a redundant cell depending upon the comparison result.

To achieve these and other objects, there is provided a circuit for repairing a defective cell after packaging of a semiconductor memory device including a normal cell and a redundant cell, and a unit for selecting the cells in dependence upon whether or not a redundant cell enable clock is generated. The defective cell repairing circuit of the present invention enables repair mode operations for mapping an address of a detected defective cell to a redundant cell. The address of the defective cell is programmed by selectively cutting fuses corresponding to each bit of the defective cell address. The defective cell address programming operation uses input terminals on the packaged semiconductor memory device which are used for address signals in a normal operation mode, so that no additional pins are required. Repair mode operations are prevented after the repair mode is completed. Thereafter, an external address supplied to the semiconductor memory device is compared with the programmed defective cell address determined by the state of the fuses, and a redundant cell is selected if the two addresses correspond.

BRIEF DESCRIPTION OF THE DRAWINGS

A more complete appreciation of the invention, and many of the attendant advantages thereof, will be readily apparent as the same becomes better understood by reference to the following detailed description, when considered in conjunction with the accompanying drawings in which like reference symbols indicate the same or similar components, wherein.

DETAILED DESCRIPTION OF THE PREFERRED EMBODIMENT

Terms in the description of the present invention are used as follows: $\phi MI$ is a repair mode enable clock for repairing a defective cell in a package state. $PMi$ (i=1, 2, ..., n) is a repair mode selecting signal. $\phi RMi$ (i=1, 2, ..., N) is a repair mode designating clock determined by decoding the repair mode selecting signal $PMi$. $PAi$ (i=1, 2, ..., q) is a signal for selecting a fuse of a program address generating unit. $Ai$ (i=1, 2, ..., r) is an address signal inputted from outside during a normal operation mode. $\phi RE$ is a redundant cell enable clock which compares the program address and the address inputted from the outside to determine whether a normal cell redundant cell is selected. $PC$ denotes a high voltage signal for enabling the repair mode. $\phi INIT$ represents a signal for initializing a latch of the repair mode enable clock $\phi MI$. $\phi C$ is a specific timing sensing signal for enabling the repair mode after packaging. $\phi Fij$ (i=1, 2, ..., m and j=1, 2, ..., q), is a program address generated by a logic combination of the repair designating clock $\phi RMi$ and a fuse selecting signal $PAj$, and represents an address of the defective cell. Finally, $\phi P$ designates a precharge clock for a fuse box.

Figure 1:
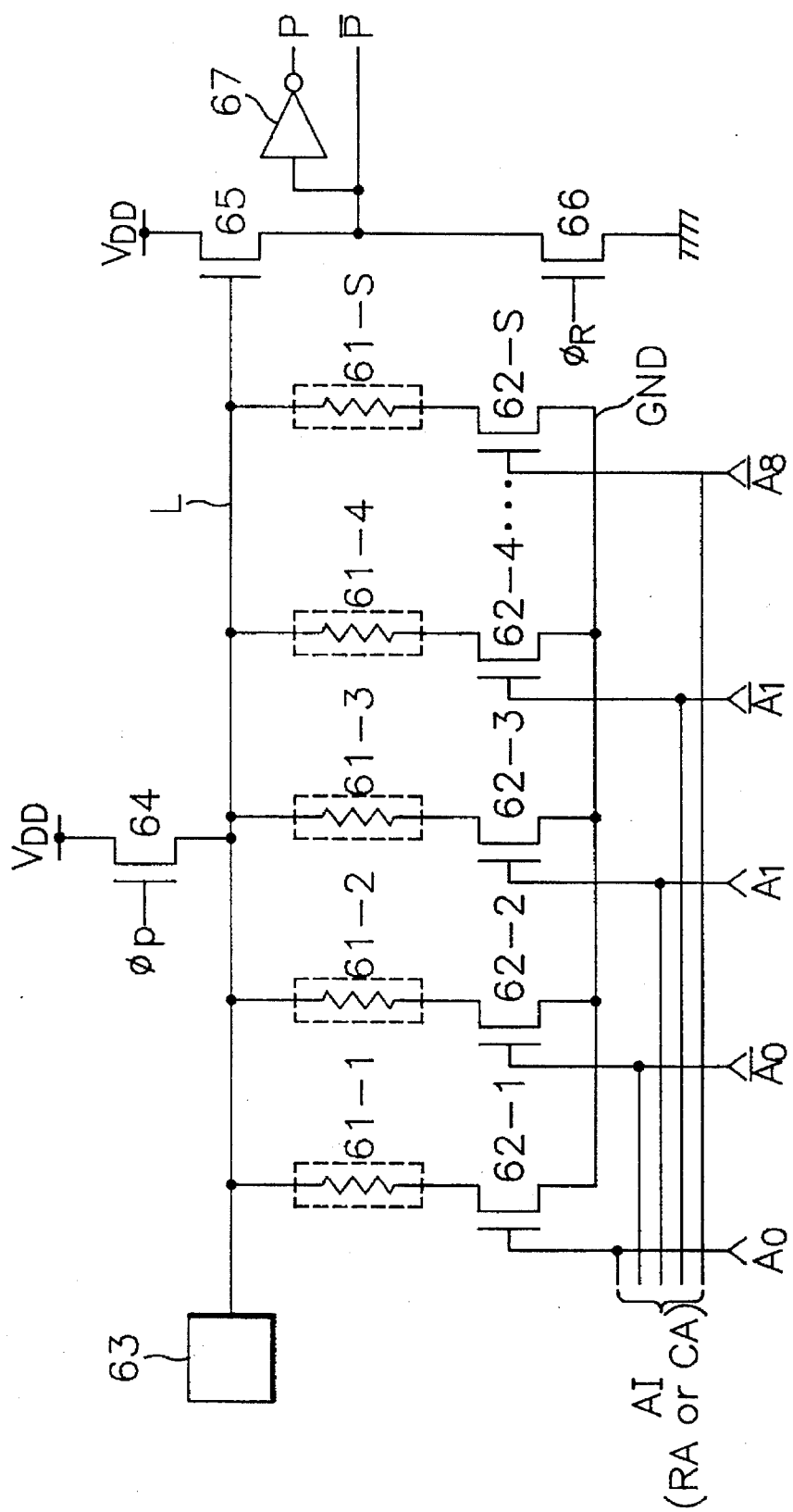
FIG. 1 is a circuit diagram illustrating the structure of a defective cell repairing circuit of a conventional semiconductor memory device.
Figure 2:
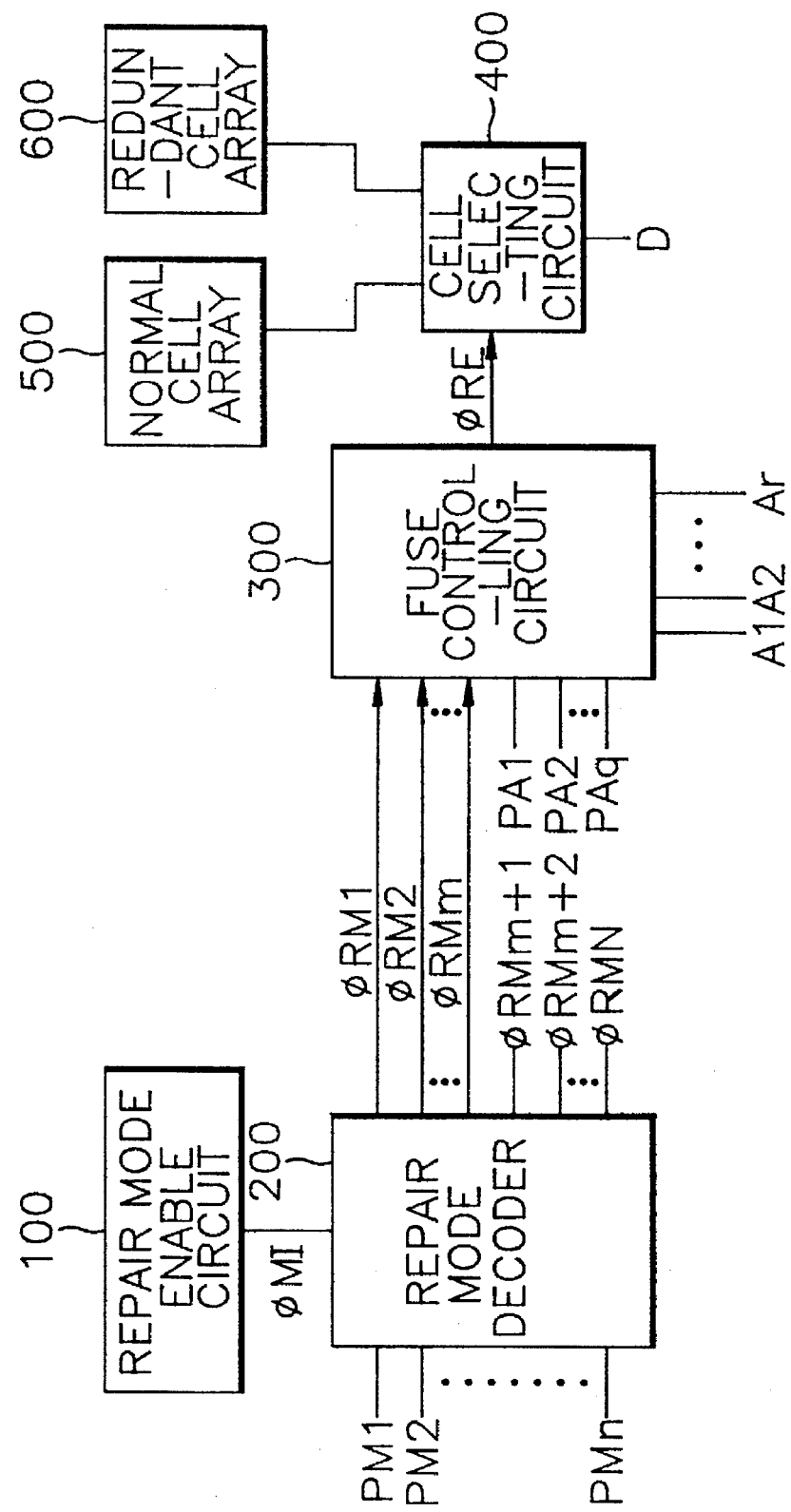
FIG. 2 is a block diagram illustrating the structure of a defective cell repairing circuit of a semiconductor memory device in accordance with the present invention.

FIG. 2 is a block diagram illustrating a structure of the defective cell repairing circuit in the semiconductor memory device in accordance with the present invention. The defective cell repairing circuit is structured so as to enable the repair mode after the device is packaged. In the repair mode, the circuit inputs the repair mode selecting signals and the fuse selecting signals which select the program address to be generated by cutting off the fuse in the selected repair mode. The defective cell repairing circuit decodes the repair mode selecting signals PM to generate corresponding repair mode designating clocks $\phi RM$. When a fuse cutting operation is selected according to the logical combination of repair mode selecting signals $\phi RM$ and fuse selecting signals PA, program addresses $\phi Fij$ are generated. Thereafter, when the normal mode is executed, the defective cell repairing circuit compares the program address $\phi Fij$ and an address A inputted from outside. If the two addresses correspond to each other, the circuit generates the redundant cell enable clock $\phi RE$ to thereby select the redundant cell. On the other hand, if the two addresses are different from each other, the defective cell repairing circuit does not generate the redundant cell enable clock $\phi RE$ and the normal cell is selected.

In FIG. 2, the repair mode enable circuit 100 is a circuit for enabling repair mode operations after the device has advanced to the package state.

Figure 3:
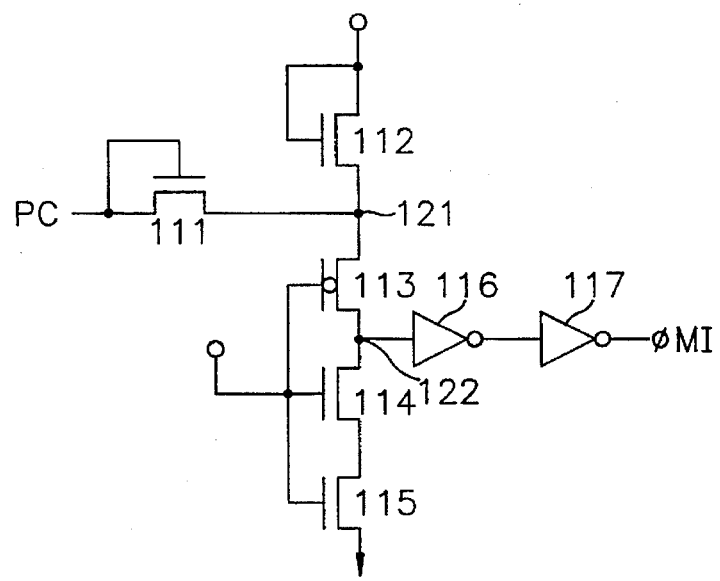
FIG. 3 is a circuit diagram illustrating one structure of the repair mode enable circuit of FIG. 2.

FIG. 3 shows a first embodiment of the repair mode enable circuit 100, which is a type of a high voltage sensing circuit. The high voltage signal PC enables a voltage provided from outside in order to execute the repair mode. The outside voltage has a level higher than that of a power supply voltage. In the structure of FIG. 3, an NMOS transistor 111 is connected in common to the high voltage signal PC at drain and gate electrodes thereof, and to a connecting node 121 at a source electrode thereof. An NMOS transistor 112 is connected in common to the power supply voltage Vcc at drain and gate electrodes thereof, and connected to the connecting node 121 at a source electrode thereof. A PMOS transistor 113 is connected between the connecting nodes 121 and 122, and connected to the power supply voltage Vcc at a gate electrode thereof. NMOS transistors 114 and 115 are connected in series between the connecting node 122 and ground potential, and connected in common to the power supply voltage Vcc at gate electrodes. Inverters 116 and 117 are connected in series between the connecting node 122 and output terminal $\phi MI$. In this structure, assuming that threshold voltages of the NMOS transistor 111 and the PMOS transistor 113 are respectively referred to as being Vtn and Vtp, where the voltage level of the high voltage signal PC inputted to the input terminal is higher than a voltage Vcc+Vtn+Vtp, the NMOS transistor 111 and the PMOS transistor 113 are turned ON. In this case, a signal of a logic "high" state is generated at the connecting node 122, thereby outputting the repair mode enable clock $\phi MI$.

Figure 4:
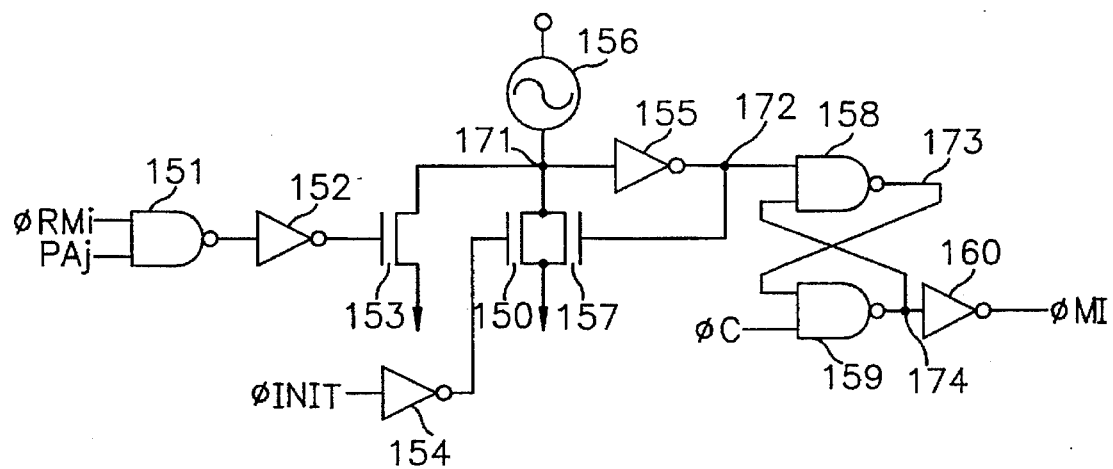
FIG. 4 is a circuit diagram illustrating another structure of the repair mode enable circuit of FIG. 2.

FIG. 4 shows a second embodiment of the repair mode enable circuit 100, which employs a timing scheme not used in the normal operating mode. In this circuit, $\phi C$ is a specific mode signal used in the present invention as the repair mode sensing signal which is generated after the device has completed a packaging process. Further, when the repairing operation is finished, fuse 156 is cut off, thereby preventing the repair mode enable clock φMI from thereafter being enabled even when the specific timing is sensed and the specific mode signal φC is enabled. This can prevent the re-enablement of the repair mode. In order to cut the fuse 156, the repair mode designating clock φRMi and the fuse selecting signal PAj corresponding to the fuse 156 have to be changed to the logic "high" state.

In FIG. 4, a NAND gate 151 receives the repair mode designating clock φRMi and the fuse selecting signal PAj to thereby logically NAND the received signals φRMi and PAj. An inverter 152 inverts an output of the NAND gate 151. An NMOS transistor 153 is connected between a connecting node 171 and the ground potential, and connected to the inverter 152 at a gate electrode thereof. The fuse 156 is connected between the power supply voltage Vcc and the connecting node 171. An inverter 155 is connected between connecting nodes 171 and 172. NMOS transistors 150 and 157 are connected between the connecting node 171 and the ground potential, the NMOS transistor 150 is connected to the latch initializing clock φINIT through an inverter 154 at a gate electrode thereof, and the NMOS transistor 157 is connected to the connecting node 172 at a gate electrode thereof. A NAND gate 158 is connected to the connecting node 172 at one input terminal thereof, to a connecting node 174 at the other input terminal thereof, and to the connecting node 173 at an output terminal thereof. A NAND gate 159 is connected to the connecting node 173 at one input terminal thereof, to the repair mode sensing signal φC at the other input terminal thereof, and to the connecting node 174 at an output terminal thereof. An inverter 160 is connected between the connecting node 174 and an output terminal supplies signal φMI.

In FIG. 4, in the initializing mode, the latch initializing clock φINIT is generated as the logic "high" signal. Then, the latch initializing clock φINIT is applied to the gate electrode of the NMOS transistor 150, and therefore the NMOS transistor 150 is turned OFF. As a result, the connecting node 171 is changed to the logic "high" state. Next, the connecting node 171 continuously maintains the logic "high" state by a latch function of the NMOS transistor 157 and the inverter 155. In this state, the repair mode enable clock φMI is determined by the repair mode sensing signal φC, which is not used in the normal operating mode. If the repair mode sensing signal φC is enabled, the repair mode enable clock φMI is also enabled to thereby generate a signal for advancing to the repair mode. After the repairing operation is performed and the program address generation is terminated by a fuse controlling circuit 300, the repair designating clock φRMi and the fuse selecting signal PAj corresponding to the specific fuse 156 are changed to the logic "high" state. In this case, the logic "high" signal is applied to the NMOS transistor 153 through the NAND gate 151 and the inverter 152. The size of the NMOS transistor 153 is selected to be large enough to cut the fuse 156. Accordingly, if the NMOS transistor 153 is turned ON, since a large amount of an electrical current flows through the fuse 156, the fuse 156 is cut. Then, the connecting node 172 is initialized to the logic "high" state, and the connecting node 173 is fixed to the logic "low" state. Hence, even when the repair mode sensing signal φC is thereafter enabled, the repair mode enable clock φMI is not enabled by the connecting node 173. The fuse 156 is cut after the repairing operation to prevent the normal operating mode from being changed into the repair mode.

If the repair mode enable clock φMI is enabled, the repair mode decoder 200, which inputs the repair mode selecting signal PM1–PMn to thereby generate the repair mode designating clock φRM1–φRMN, is enabled. The repair mode decoder 200 decodes the inputted repair mode selecting signal PM1–PMn to thereby enable one of the repair mode designating clocks φRM1–φRMN. The enabled clock designates the desired repair mode to be executed. The reason that a plurality of repair modes are required instead of just one is as follows. First, even though a plurality of defective cells may require repair with a plurality of the defective cell addresses to be programmed, the number of address pins is limited. Accordingly, in order to program the plurality of defective cell addresses, while designating the plurality of repair modes and changing the repair mode, the defective cell addresses have to be sequentially programmed. Second, in a semiconductor memory device such as a dynamic random address memory DRAM, an address multiplexing method is employed in which the number address pins is less than the number of necessary addresses. Consequently, a plurality of repair modes are required to program the defective cell addresses.

Figure 5:
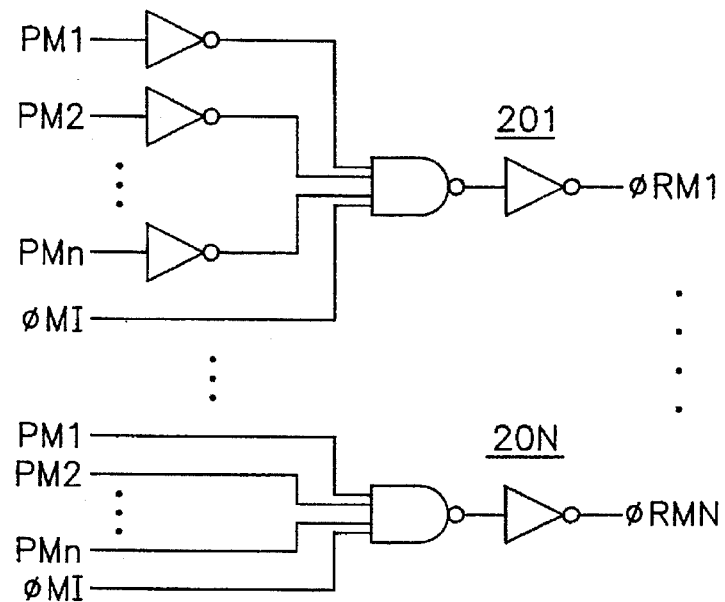
FIG. 5 is a circuit diagram illustrating one structure of the repair mode decoder of FIG. 2.

FIG. 5 shows a circuit diagram of the repair mode decoder 200 described above. In FIG. 5, the number of the repair modes can be provided in proportion to a combination of the bit number of the repair mode selecting signal PM1–PMn. The repair mode decoder 200 includes N stages of bit decoders 201-1 to 201-N. Each bit decoder is enabled by the repair mode enable clock φMI to thereby decode the inputted repair mode signal PM1–PMn, and to generate the repair mode designating clock φRM1–φRMN.

The repair mode designating clocks φRM1–φRMm outputted from the repair mode decoder 200 are applied to a fuse controlling circuit 300. The fuse controlling circuit 300 includes a unit for analyzing logic states of the repair mode designating clocks φRM1–RMm and the fuse selecting signals PA1–PAq to thereby generate the program address φFij, as well as a unit for comparing the program address φFij with an external address A1–Ar to thereby generate a redundant cell enable clock φRE. That is, in the fuse controlling circuit 300, the defective cell addresses are stored by cutting the fuse during the repair mode. In the normal mode, an address provided from outside is compared with the programmed address, and then a signal for selecting a normal cell array 500 or a redundant cell array 600 is generated. In the fuse controlling circuit 300, the fuse selecting signals PA1–PAq are used to select the addresses to be programmed, and since the repair mode and the normal mode are separately used, it is possible for the address input terminals to be used as input terminals for the fuse selecting signals PA1–PAq. Likewise, it is possible for the address input terminals to be used as input terminals for the repair mode selecting signals PM1–PMn. However, since the repair mode selecting signals PM1–PMn and the fuse selecting signals PA1–PAq are simultaneously used in the repair mode, it is impossible for the two signals to be inputted through the identical input terminals.

In the preferred embodiment of the present invention, the repair mode selecting signals PM1–PMn and the fuse selecting signal PA1–PAq are inputted through the address input terminals. Assuming that the number of the address input terminals is 8 and that the number of the defective cell addresses is also 8, when address input terminals A5–A8 are assigned to the input terminals of the repair mode selecting signal PMi and the address input terminals A1–A4 are assigned to the fuse selecting signal PAj, following relationship is given.

| PM1 = A5 | PA1 = A1 |
|---|---|
| PM2 = A6 | PA2 = A2 |
| PM3 = A7 | PA3 = A3 |
| PM4 = A8 | PA4 = A4 |

Here, since the number of the repair mode selecting signals PMi is 4, 16 ($16=2^4$) repair mode designating clocks $\phi$RM1–$\phi$RM16 can be provided. The number of the fuse selecting signals PAj is also 4, and therefore, in every repair mode, 4 bits of the address to be programmed can be designated. Then, assuming that the defective cell addresses are designated to the 8-bit input, two repair modes have to be sequentially determined to program each defective cell address. Further, since the total number of repair modes is 16, 8 different defective cell addresses can be programmed. The structure of the fuse controlling circuit 300 will be described hereinafter.

Figure 6:
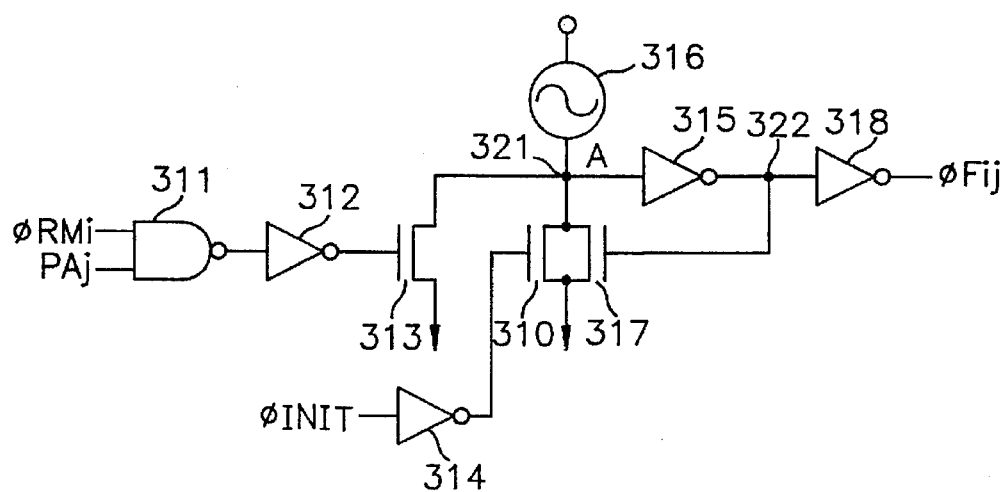
FIG. 6 is a circuit diagram illustrating one structure of the program address generating unit in the fuse controlling circuit of FIG. 2.

FIG. 6 is a circuit diagram illustrating the structure of a program address generating unit in a fuse controlling circuit 300, which shows the process generating the 1-bit program address $\phi$Fij. The program address generating unit must be structured in proportion to the total number of repair modes and fuse selecting signals. In the structure of the program address generating unit, a NAND gate 311 receives the repair mode designating clock $\phi$RMi and the fuse selecting signal PAj and logically NAND's the received signals. An inverter 312 inverts an output of the NAND gate 311. An NMOS transistor 313 is connected between a connecting node 321 and a ground potential, and connected to the inverter 312 at a gate electrode thereof. A fuse 316 is connected between the power supply voltage Vcc and the connecting node 321. An inverter 315 is connected between the connecting nodes 321 and 322. Both NMOS transistors 310 and 317 are connected between the connecting node 321 and the ground potential. NMOS transistor 310 is connected to the latch initializing clock $\phi$INIT via the inverter 314 at a gate electrode thereof, and NMOS transistor 317 is connected to the connecting node 322 at a gate electrode thereof. An inverter 318 is connected between the connecting node 322 and an output terminal. In the operation of the program address generating unit, upon the initializing mode, the latch initializing clock $\phi$INIT is generated as a signal of the logic "high" state. Since the latch initializing clock $\phi$INIT is applied to the gate electrode of the NMOS transistor 310, the NMOS transistor 310 is turned OFF and accordingly the connecting node 321 is changed to the logic "high" state. Thereafter, the connecting node 321 continuously maintains the logic "high" state by a latch function of the NMOS transistor 317 and the inverter 315. Accordingly, if the repair mode designating clock $\phi$RMi and the fuse selecting signal PAj are not generated, the fuse 316 is not cut off, and then the program address $\phi$Fij of the logic "high" signal is generated through the inverter 318. Then, if the repair designating clock $\phi$RMi and the fuse selecting signal PAj are generated as signals of the logic "high" state, the logic "high" signal is applied to the NMOS transistor 313 by the NAND gate 311 and the inverter 312. In this case, the size of the NMOS transistor 313 is designed to be large enough to cut the fuse 316. Accordingly, if the NMOS transistor 313 is turned ON, a large amount of electrical current flows through the fuse 316 and the fuse 316 is cut. Then, the connecting node 322 is initialized to the logic "high" state, and accordingly the program address $\phi$Fij of the logic "low" signal is generated through the inverter 318. As a result, if the program process above mentioned is repeated, the fuse of the corresponding program address generating units is cut and the program address is generated in the designated repair mode.

If the operations as described above are sequentially repeated, the program addresses of $\phi$F11, $\phi$F12, $\phi$F13 and $\phi$F14 are generated in the $\phi$RM1 mode, and the program addresses of $\phi$F21, $\phi$F22, $\phi$F23 and $\phi$F24 are generated in the $\phi$RM2 mode. When the 8-bit program address as mentioned above is generated, the program address is applied to a redundant cell enable clock $\phi$RE generating circuit structured as shown in FIG. 7.

Figure 7:
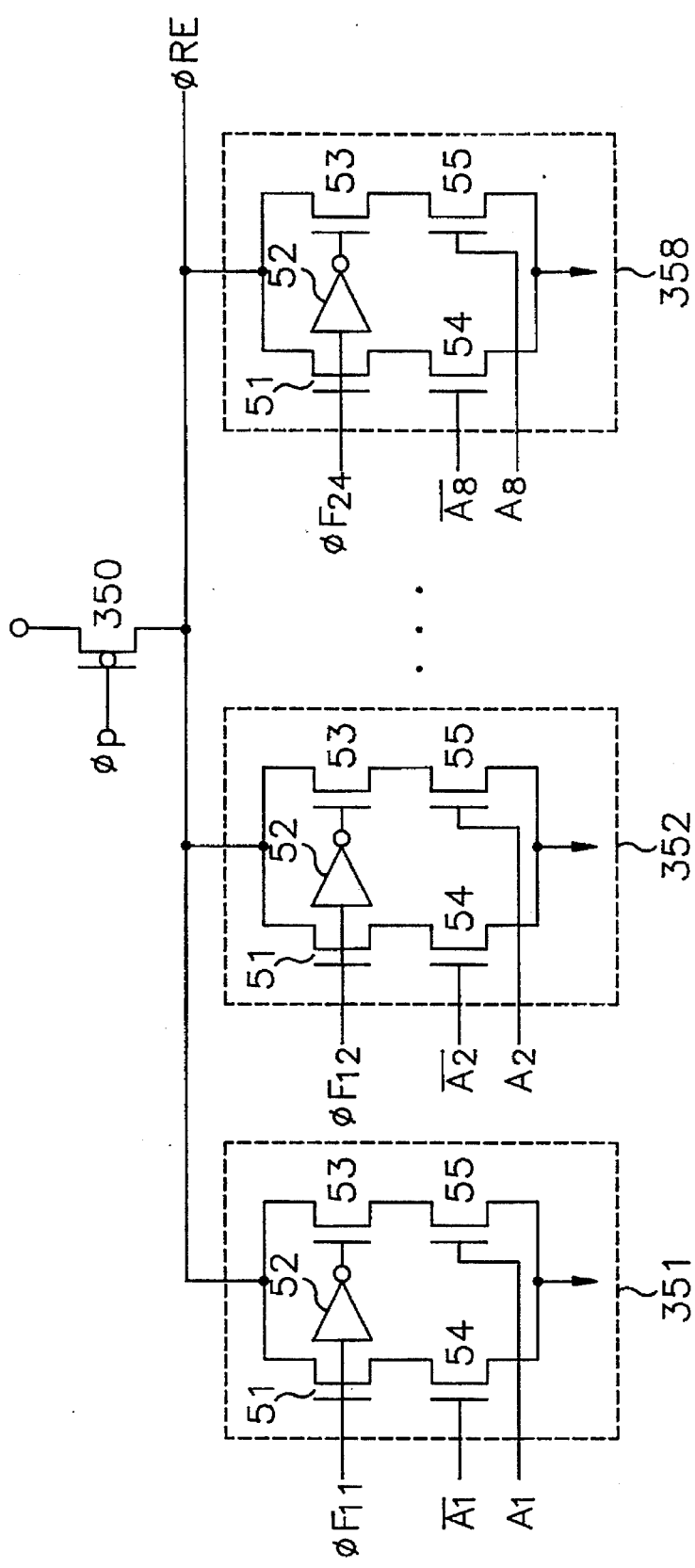
FIG. 7 is a circuit diagram illustrating one structure of a circuit for generating a redundant cell enable clock in the fuse controlling circuit of FIG. 2.

FIG. 7 is a first embodiment showing a redundant cell enable clock $\phi$RE generating circuit. The first embodiment as shown in FIG. 7 is embodied by comparative devices 351 to 358 and a PMOS transistor 350. The comparative devices 351 to 358 compare whether or not the 8 bits program addresses $\phi$F11, $\phi$F12, $\phi$F13, $\phi$F14, $\phi$F21, $\phi$F22, $\phi$F23 and $\phi$F24 correspond to the external input addresses A1 to A8. PMOS transistor 350 is connected between the power supply voltage Vcc and a common output line of the comparative devices 351 to 358, and connected to a fuse box precharge clock $\phi$P at a gate electrode thereof.

In FIG. 7, the comparative devices 351 to 358, which are respectively connected to a drain electrode of the PMOS transistor 350, each comprise NMOS transistors 51, 53, 54 and 55. NMOS transistor 51 is connected to the program address $\phi$Fij at a gate electrode thereof. NMOS transistor 53 is connected to the drain electrode of the PMOS transistor 350 and connected to the program address $\phi$Fij inverted through an inverter 52 at a gate electrode thereof. NMOS transistor 54 is connected between a source electrode of the NMOS transistor 51 and a ground potential and connected to an inverse address $\overline{Ar}$ at a gate electrode thereof. Further, the NMOS transistor 55 is connected to a source electrode of the NMOS transistor 53 and the ground potential and connected to an address Ar at a gate electrode thereof. The relationship between the program addresses and the external addresses in the comparative devices 351 to 358 is given below in Table 1.

TABLE 1

| A | 351 | 352 | 353 | 354 | 355 | 356 | 357 | 358 |
|---|---|---|---|---|---|---|---|---|
| B | $\phi$F11 | $\phi$F12 | $\phi$F13 | $\phi$F14 | $\phi$F21 | $\phi$F22 | $\phi$F23 | $\phi$F24 |
| C | A1 | A2 | A3 | A4 | A5 | A6 | A7 | A8 |

A: comparative device, B: program address, C: external address.

In FIG. 7, if the fuse box precharge charge signal $\phi$P is generated as the logic "low" signal, the PMOS transistor 350 is turned ON, thereby precharging the output line. In this state, each of the comparative devices 351 to 358 compares the program addresses $\phi$F11, $\phi$F12, $\phi$F13, $\phi$F14, $\phi$F21, $\phi$F22, $\phi$F23 and $\phi$F24 with the external addresses applied to A1 to A8. If an external address which does not correspond to the program addresses is applied, the precharge charge is discharged to the ground potential, and therefore the redundant cell enable clock $\phi$RE is generated as the logic "low" signal. However, if all of the external addresses applied to A1 through A8 correspond to the program addresses, a path for discharging the precharged charge to the ground potential is cut, and the redundant cell enable clock $\phi$RE is generated as the logic "high" signal.

Figure 8:
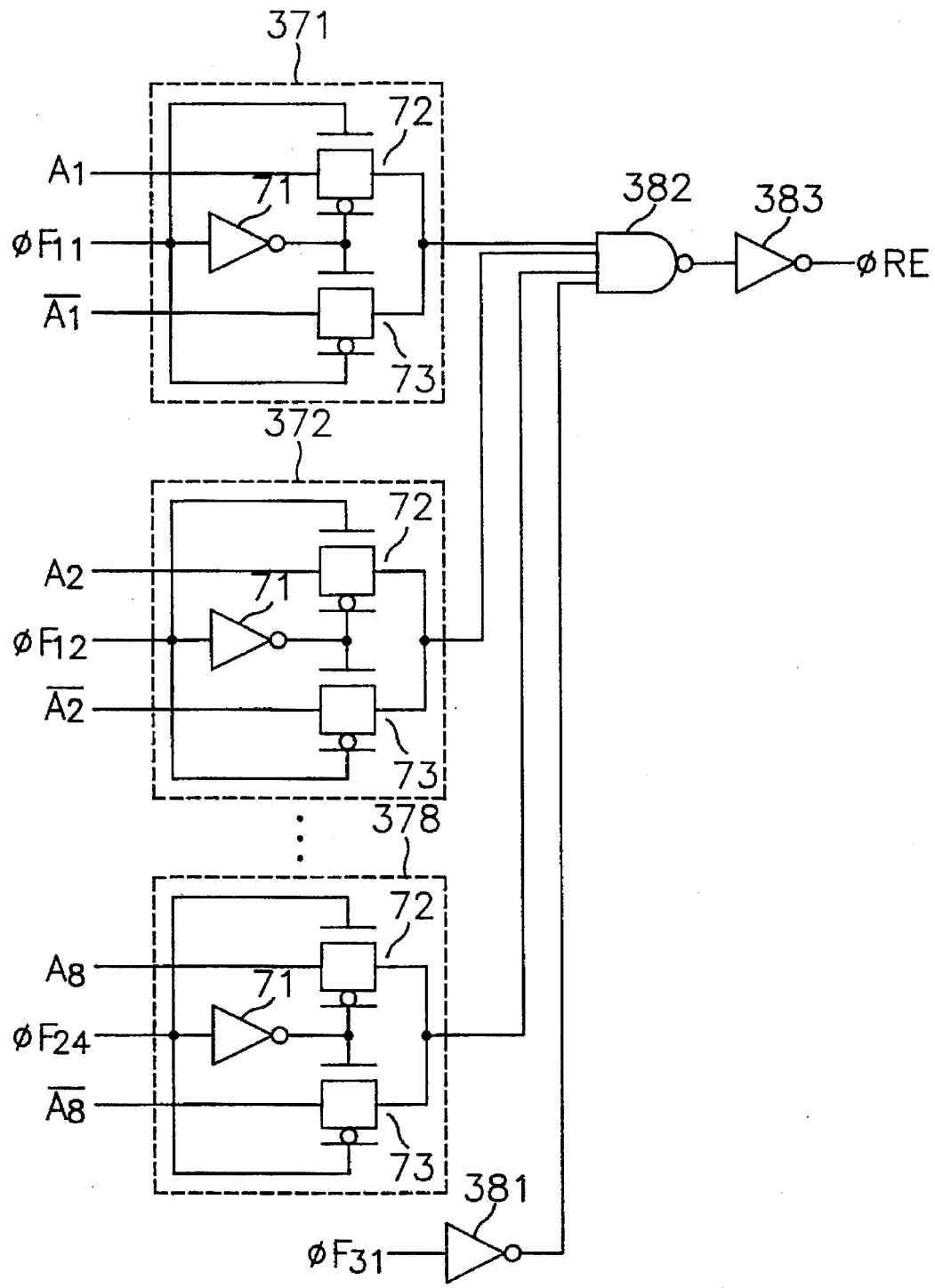
FIG. 8 is a circuit diagram illustrating another structure of a circuit for generating the redundant cell enable clock in the fuse controlling circuit of FIG. 2.

FIG. 8 is a second embodiment showing a redundant cell enable clock $\phi$RE generating circuit. The second embodiment as shown in FIG. 8 includes transmitting devices 371 to 378, an inverter 381, a NAND gate 382 and an inverter 383. The transmitting devices 371 to 378 transmit the external input addresses A1 through A8 according to the state of the 8-bit program addresses φF11, φF12, φF13, φF14, φF21, φF22, φF23 and φF24. The inverter 381 inverts a signal φF31 to determine whether or not the redundant cell is used. The NAND gate 382 receives the outputs of the transmitting devices 371 to 378 and the signal outputted from the inverter 381 to logically NAND the received outputs. Further, the inverter 383 inverts the output of the NAND gate 382. Here, the signal φF31 is an output of a circuit structured in the same manner as the program address generating unit, and determines whether or not the redundant cell is used, depending upon the cut state of the fuse included in the circuit.

FIG. 8 employs a static logic. In this embodiment, the signal φF31 determining whether or not the redundant cell is used is additionally designated instead of using the precharge clock and the precharge element.

In FIG. 2, the cell selecting circuit 400 has a function of selecting the normal cell array 500 or the redundant cell array 600 according to the logic state of the redundant cell enable clock φRE. Accordingly, the cell selecting circuit 400 includes decoders for accessing the cell, means for inputting/outputting data to/from the cell, and all means for controlling these decoders and input/output means.

Figure 9:
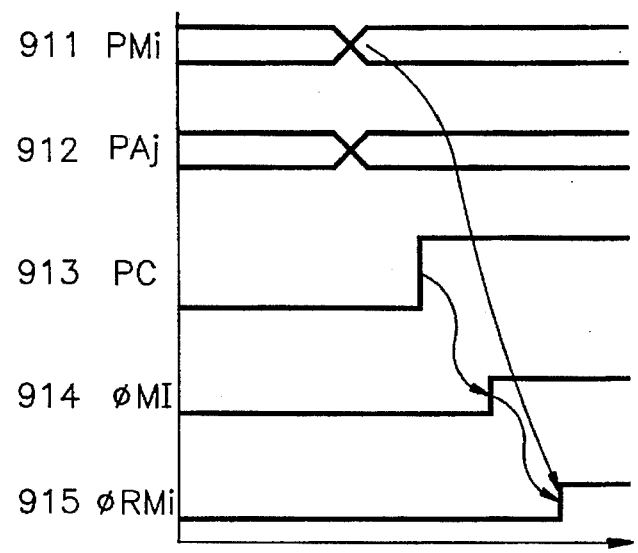
FIG. 9 is a timing diagram illustrating operational characteristics of cutting off the fuse in the structures illustrated in FIGS. 2 through 8.

FIG. 9 is a timing diagram illustrating operational characteristics of the repair mode in accordance with the present invention in FIGS. 2 through 8. In order to execute the repair mode, the repair mode selecting signal PMi is inputted to the repair mode decoder 200 as shown in 911 of FIG. 9, and the fuse selecting signal PAj is inputted to the fuse controlling circuit 300 as shown in 912 of FIG. 9. And then, the repair mode enable circuit 100 is controlled to advance to the repair mode. FIG. 9 shows the repair mode being enabled in response to the high voltage signal PC. In FIG. 9, if the high voltage signal PC is inputted as shown in 913, the repair mode enable circuit 100 as shown in FIG. 3 detects an input of the high voltage signal PC to thereby generate the repair mode enable clock φMI as shown in 914 of FIG. 9. Once the repair mode enable clock φMI is generated, the repair mode decoder 200 mentioned above decodes the repair mode selecting signal PMi to thereby generate the repair mode designating clock φRMi. In the fuse controlling circuit 300, the program address generating unit structured as shown in FIG. 6 drives a circuit including the fuse corresponding to the repair mode designating clock φRMi and the fuse selecting signal PAj, thereby cutting the fuse. Accordingly, when the fuse has been cut, the defective cell addresses are programmed.

Figure 10:
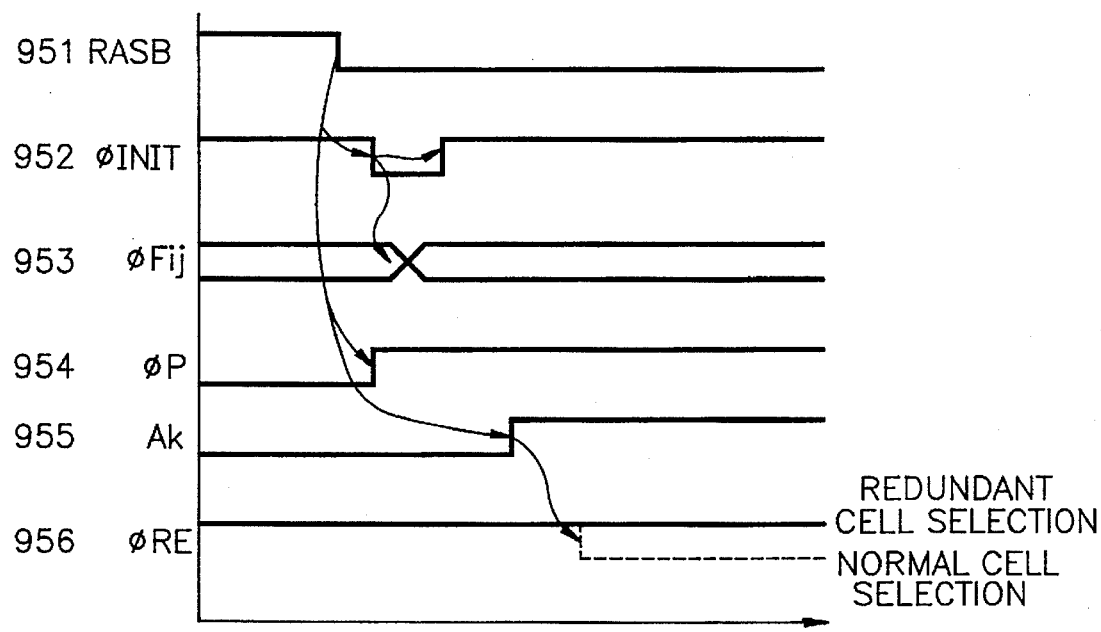
FIG. 10 is a timing diagram illustrating operational characteristics of enabling a redundant cell in the structures illustrated in FIGS. 2 through 8.

FIG. 10 is timing diagram illustrating an operation process of a normal operation mode after the repair mode is completed by programming the defective cell addresses as described above. First, if the row address strobe RASB is enabled as shown in 951 of FIG. 10, a stand-by state of accessing data is changed to the operation mode state. Then, the latch initializing clock φINIT is enabled as shown in 952 of FIG. 10, and the precharge clock φP is enabled as shown in 954 of FIG. 10. Therefore, the program address generating unit as shown in FIG. 6 accurately determines the logic in accordance with existence/nonexistence of the program as shown in 953 of FIG. 10, and the redundant cell enable clock φRE generating unit is precharged to the level of the power supply voltage as shown in 954. Then, if the external address Ak is inputted to the redundant cell enable clock generating unit as shown in 955, the redundant cell enable clock generating unit compares whether or not the external address Ak corresponds to the program addresses φFij to thereby generate the redundant cell enable clock φRE. Ill this case, the cell selecting circuit 400 analyzes the logic of the redundant cell enable clock φRE. For example, if the redundant cell enable clock φRE is the logic "low" signal, the cell selecting circuit 400 selects the normal cell array 500, but if the redundant cell enable clock φRE is the logic "high" signal, the redundant cell array 600 is selected.

In the semiconductor memory device described above, even when a defective cell is generated through a burn-in test performed after packaging, for example, there are advantages in that the defective cell can be easily repaired and the defective cell addresses can be programmed without requiring an additional external pin when repairing the defective cell. Moreover, there is an advantage in that since the repair mode is freely selected, a plurality of defective cell addresses are also programmed.

While the present invention has been described above with reference to the preferred embodiment, it will be appreciated by those skilled in the art that various substitutions and modifications can be made without departing from the spirit and scope of the invention as set forth in the following claims.

What is claimed is:

1. A semiconductor memory device comprising:
   a plurality of memory cells, said plurality of memory cells including a normal cell having a cell address and a defective cell having a defective cell address;
   a redundant cell; and
   a defective cell repairing circuit, said defective cell repairing circuit mapping said defective cell address to correspond to said redundant cell, said defective cell repairing circuit including:
     a repair mode controller that generates a repair mode enable clock in response to an external mode signal, said repair mode controller being unable to generate said repair mode enable clock after completion of a repair mode of said semiconductor memory device;
     a program address generator responsive to said repair mode enable clock, said program address generator having an internal fuse, said program address generator receiving said defective cell address and setting a state of said internal fuse to map said defective cell address to said redundant cell; and
     a redundant cell enable circuit that causes said redundant cell to be selected when said defective cell address is supplied to said semiconductor memory device after said state of said internal fuse has been set.

2. A semiconductor memory device according to claim 1, wherein said external mode signal is a high voltage applied to said semiconductor memory device during said repair mode.

3. A semiconductor memory device according to claim 1, wherein said repair mode controller includes:
   a latch circuit for latching said repair mode enable clock during said repair mode; and
   a fuse connected to said latch circuit, said fuse being cut after completion of said repair mode.

4. A semiconductor memory device according to claim 1, further comprising a plurality of input terminals that receive said external mode signal and said defective cell address during said repair mode, and receive external address signals during a normal operation mode.

5. A defective cell repairing circuit for a packaged semiconductor memory device, said defective cell repairing circuit comprising:
   a repair mode controller that generates a repair mode enable clock in response to an external mode signal;

a repair mode decoder that receives a repair mode selecting signal, and generates a repair mode designating clock corresponding to said repair mode selecting signal in response to said repair mode enable clock; and a program address generator having an internal fuse, said program address generator receiving a fuse selecting signal and said repair mode designating clock, a defective cell program address being defined by a logical combination of said fuse selecting signal and said repair mode designating clock, said program address generator performing said logical combination and setting a state of said internal fuse in correspondence with said defective cell program address defined by said logical combination of said fuse selecting signal and said repair mode designating clock.

6. The defective cell repairing circuit according to claim 5, further comprising a plurality of input terminals that receive said repair mode selecting signal and said fuse selecting signal during a repair mode, and receive external address signals during a normal operation mode.

7. The defective cell repairing circuit according to claim 6, further comprising a redundant cell enable circuit that receives said external address signals during a normal operation mode, and generates a redundant cell enable clock in response to whether an address selected by said external address signal corresponds to said defective cell program address.

8. The defective cell repairing circuit according to claim 5, wherein said program address generator includes a plurality of internal fuses in proportion to a total number of defective cell program addresses selectable by said fuse selecting signal and said repair mode selecting signal.

9. The defective cell repairing circuit according to claim 8, further comprising a plurality of input terminals that receive said repair mode selecting signal and said fuse selecting signal during a repair mode, and receive external address signals during a normal operation mode.

10. The defective cell repairing circuit according to claim 9, further comprising a redundant cell enable circuit that receives said external address signald during a normal operation mode, said redundant cell enable circuit generating a redundant cell enable clock when an address selected by said external address signal corresponds to one of said defective cell program addresses, and generating a redundant cell disable clock when the address selected by said external address signal does not correspond to one of said defective cell program addresses.

11. The defective cell repairing circuit according to claim 5, wherein said repair mode controller generates said repair mode enable clock in response to a high voltage applied to said semiconductor memory device during a repair mode.

12. The defective cell repairing circuit according to claim 5, wherein said repair mode controller includes:

a fuse;

a latch circuit having an input connected to said fuse, said latch circuit latching said repair mode enable clock in response to said external mode signal; and a fuse cutting circuit connected to said fuse, said fuse cutting circuit cutting said fuse in response to a repair mode completion signal, said latch circuit disabling said repair mode enable clock in response said fuse being cut so that said repair mode controller is unable to generate said repair mode enable clock after said fuse is cut.

13. A defective cell repairing device for a semiconductor memory device, said defective cell repairing device comprising:

a repair mode controller that generates a repair mode enable clock in response to a high voltage supplied to said semiconductor memory device when said semiconductor memory device is in a package state;

a repair mode decoder that decodes a repair mode selecting signal in response to said repair mode enable clock, and generates a corresponding repair mode designating clock;

a fuse controlling circuit that receives said repair mode designating clock and a fuse selecting signal, said fuse controlling circuit having a plurality of fuses in proportion to a total number of defective cell addresses capable of being designated by said repair mode designating clock and said fuse selecting signal, said fuse controlling circuit cutting a corresponding one of said fuses according to a logical combination of said repair mode designating clock and said fuse selecting signal, thereby programming a designated defective cell address; and a redundant cell enable clock generator that receives an external address signal and compares an address designated by said external address signal to said defective cell addresses programmed by said fuse controlling circuit, said redundant cell enable clock generator generating a redundant cell enable clock if said address corresponds to one of said defective cell addresses and generating a redundant cell disable clock if said address does not correspond to one of said defective cell addresses.

14. The defective cell repairing circuit according to claim 13, further comprising a plurality of input terminals that receive said repair mode selecting signal and said fuse selecting signal during a repair mode of said semiconductor memory device, and receive said external address signal during a normal operation mode of said semiconductor memory device.

15. A defective cell repairing device for a semiconductor memory device, said defective cell repairing device comprising:

a repair mode enable circuit for generating a repair mode enable clock during a repair mode of said semiconductor memory device, said repair mode enable circuit having a mode selection fuse, said mode selection fuse being cut when said repair mode is completed, said repair mode enable circuit being thereafter unable to generate said repair mode enable clock;

a repair mode decoder for decoding a repair mode selecting signal in response to said repair mode enable clock, and for generating a corresponding repair mode designating clock;

a fuse controlling circuit that receives said repair mode designating clock and a fuse selecting signal, said fuse controlling circuit having a plurality of fuses in proportion to a total number of defective cell addresses capable of being designated by said repair mode designating clock and said fuse selecting signal, said fuse controlling circuit cutting a corresponding one of said fuses according to a logical combination of said repair mode designating clock and said fuse selecting signal, thereby programming a designated defective cell address; and a redundant cell enable clock generator that receives an external address signal and compares an address designated by said external address signal to said defective cell addresses programmed by said fuse controlling circuit, and generates a redundant cell enable clock if said address corresponds to one of said defective cell addresses and generates a redundant cell disable clock if said address does not correspond to one of said defective cell addresses.

16. The defective cell repairing circuit according to claim 15, further comprising a plurality of input terminals that receive said repair mode selecting signal and said fuse selecting signal during said repair mode of said semiconductor memory device, and receive said external address signal during a normal operation mode of said semiconductor memory device.

17. A method for repairing a defective cell of a packaged semiconductor memory device, said method comprising the steps of:

enabling a repair mode of said semiconductor memory device in response to an external command;

decoding a defective cell address selected by a repair mode selecting signal and a fuse selecting signal;

cutting a fuse to thereby program said defective cell address;

disabling said repair mode;

comparing an external input address with said defective cell address;

selecting a normal cell when said external input address does not correspond to said defective cell address; and selecting a redundant cell when said external input address corresponds to said defective cell address.

18. The method for repairing a defective cell as claimed in claim 17, wherein said step of comparing said external input address with said defective cell address is performed in response to a row address strobe signal.

* * * * *